United States Patent [19]

Debe

[11] Patent Number: 4,620,963
[45] Date of Patent: Nov. 4, 1986

[54] VAPOR TRANSPORT REACTOR WITH COMPOSITE METAL-GLASS TUBE

[75] Inventor: Mark K. Debe, Stillwater, Minn.

[73] Assignee: Minnesota Mining and Manufacturing Company, St. Paul, Minn.

[21] Appl. No.: 702,671

[22] Filed: Feb. 19, 1985

[51] Int. Cl.[4] .............................................. C30B 23/00
[52] U.S. Cl. .................................... 422/240; 422/247; 118/726
[58] Field of Search ............... 422/247, 245, 104, 240; 156/610; 427/733, 728, 726; 118/726

[56] References Cited

U.S. PATENT DOCUMENTS

| | | | |
|---|---|---|---|
| 3,014,791 | 12/1961 | Benzing et al. | 422/245 |
| 3,499,670 | 3/1970 | De Woody | 285/355 |
| 3,695,642 | 10/1972 | De Woody | 285/133 R |
| 4,000,716 | 1/1977 | Kurata et al. | 422/245 |
| 4,123,989 | 11/1978 | Jewett | 118/733 |
| 4,299,649 | 11/1981 | Gentile et al. | 156/610 |

OTHER PUBLICATIONS

"Low-Stress Physical Vapor Growth (PVT)" by F. Rosenberger and G. H. Westphal, Journal of Crystal Growth 43 (1978), 148-152.
"Heat Transfer and Temperature Oscillations in Chemical Vapor Transport Crystal Growth"—F. Rosenberger, M. C. DeLong and J. M. Olson, Jl of Crystal Growth 19(1973), 317-328.

Primary Examiner—Hiram H. Bernstein
Attorney, Agent, or Firm—Donald M. Sell; James A. Smith; David W. Anderson

[57] ABSTRACT

A reactor for use in chemical or physical vapor transport film or crystal growth experiments includes a composite reaction tube which is comprised of an open stainless steel tube which is fused to a closed glass tube. The stainless steel portion of the reaction tube supplies mechanical strength and rigidity for sealing purposes while the glass portion of the composite tube permits visual observation of crystal growth within the composite tube.

12 Claims, 5 Drawing Figures

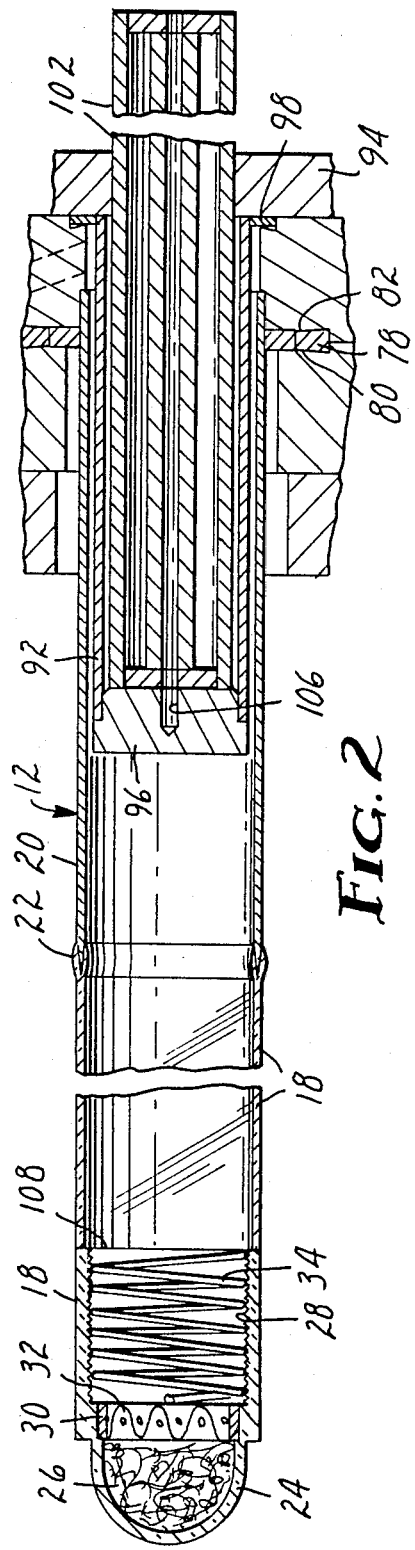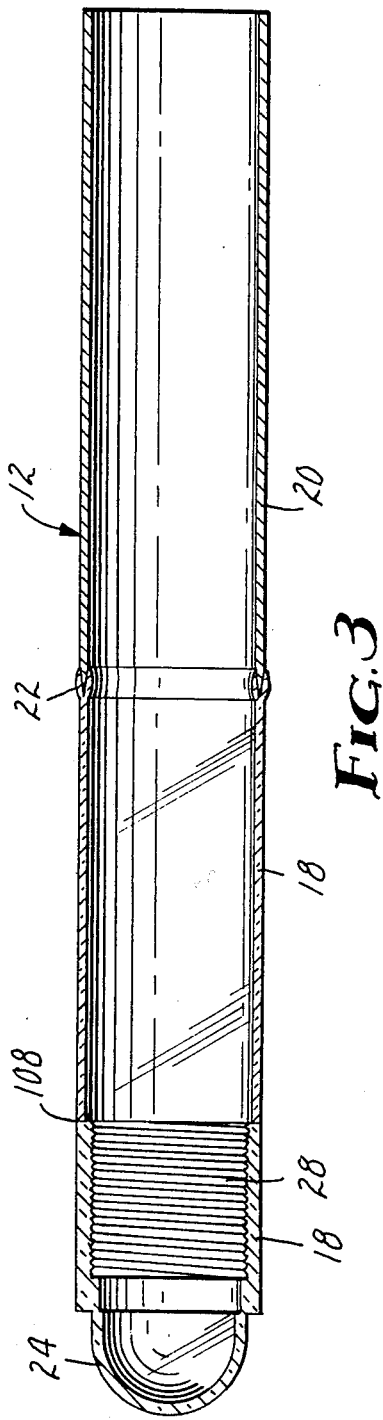

VAPOR TRANSPORT REACTOR WITH COMPOSITE METAL-GLASS TUBE

BACKGROUND OF THE INVENTION

1. Field of the Invention

The present invention relates to reactors useful in chemical or physical vapor transport crystal growth.

2. Description of the Prior Art

In order to study the characteristics and properties of highly ordered films or crystals of organic or inorganic materials, it is desirable to produce crystals or films which excel in purity, homogeneity and size. One method of increasing the quality of these films or crystals ("crystals" hereafter will include films) is physical vapor transport crystal growth wherein a solid source material is heated above its vaporization temperature and the vapor allowed to crystallize on a platen cooled below the crystallization temperature of the material. Another method is chemical vapor transport crystal growth wherein the source material reacts with another material while in the vapor state.

The source material is contained within the closed end of a glass tube into which is inserted a deposition surface, which may be a platen of metal or a semiconductor material, upon which the source material vapors may crystallize. The source material is heated above its vaporization temperature by heating elements surrounding the glass tube and the platen within the tube is cooled below the crystallization temperature of the source material by connecting the platen to a heat sink.

One material whose crystals are commonly produced by this method is GeSe which must be heated to approximately 520 degrees C. for vaporization while the platen must be cooled to approximately 420 degrees C. to promote crystallization. To control the crystals produced, the glass tube is usually evacuated of air and filled with a buffer or transport gas which is either inert with respect to the source material at its vaporization temperature or which reacts in a controlled manner with the source material. A transport gas useful in the production of GeSe crystals is $GeI_4$, which may be present in the tube at a partial vacuum throughout or at pressures above atmospheric. To contain the vacuum or pressure within the glass tube, the glass tube is sealed in present reactors by fusing the tube directly to the platen or to a heat conductive bar extending from the platen. This sealing method causes problems and has serious disadvantages because the tube must be broken to obtain the crystals and the entire glass-tube/platen assembly must be replaced. Breakage of the glass tube may also fracture or contaminate the crystals and render them useless for experimental purposes.

Recently it has been found that superior crystal growth can be achieved in microgravity environments such as those found aboard orbiting vehicles. The cost of experiments under these conditions is extremely high and loss of experimental samples is disastrous because the opportunities for future experiments are infrequent.

SUMMARY OF THE INVENTION

A vapor transport reactor according to the present invention eliminates the problems associated with breakage of the glass tube by providing a reaction tube having a closed end and an open end, a source material contained within the tube and disposed at the closed end of the reaction tube, means for heating the tube in the region of the source material to a temperature in excess of the vaporization temperature of the source material at the pressure within the tube and thereby producing a vapor of the source material within the tube, a platen disposed within the tube between the opened and closed ends and exposed to the source material vapor for the deposition of crystallized source material, means for cooling the platen below the crystallization temperature at the pressure within the tube to cause the deposition of crystallized source material on the platen and means for demountably sealing the end of the tube opposite the closed end containing the source material.

Assembly and demounting of the tube with respect to the reactor is facilitated by forming the tube as a composite tube having a closed containment end for containing the source material and an open end having a sealing surface for sealing a composite tube to the vapor transport reactor, with the composite tube including a metal tube providing the open end and the sealing surface joined intermediate the opened and closed ends to a coaxial transparent glass tube providing the closed containment end so that the metal tube provides the composite tube with mechanical strength and rigidity at the sealing surface and the glass tube provide chemical inertness and permits visual observation into the composite tube.

The metal and glass tubes are preferably equal in length and have corresponding inner and outer diameters, and the glass portion of the composite tube preferably includes internal helical threads adjacent the closed containment end and means engaging the threads for retaining the source material within the closed end of the composite tube.

BRIEF DESCRIPTION OF THE DRAWING

The present invention will be more thoroughly described with reference to the accompanying drawings, wherein like numbers refer to like parts in the several views, and wherein:

FIG. 2 is a longitudinal, cross-sectional view of a portion of the reactor of FIG. 1 and a crystal growth reaction chamber forming a portion of the reactor;

FIG. 3 is a longitudinal, cross-sectional view of the reaction chamber of FIG. 2;

DESCRIPTION OF THE PREFERRED EMBODIMENT

Figure 1:
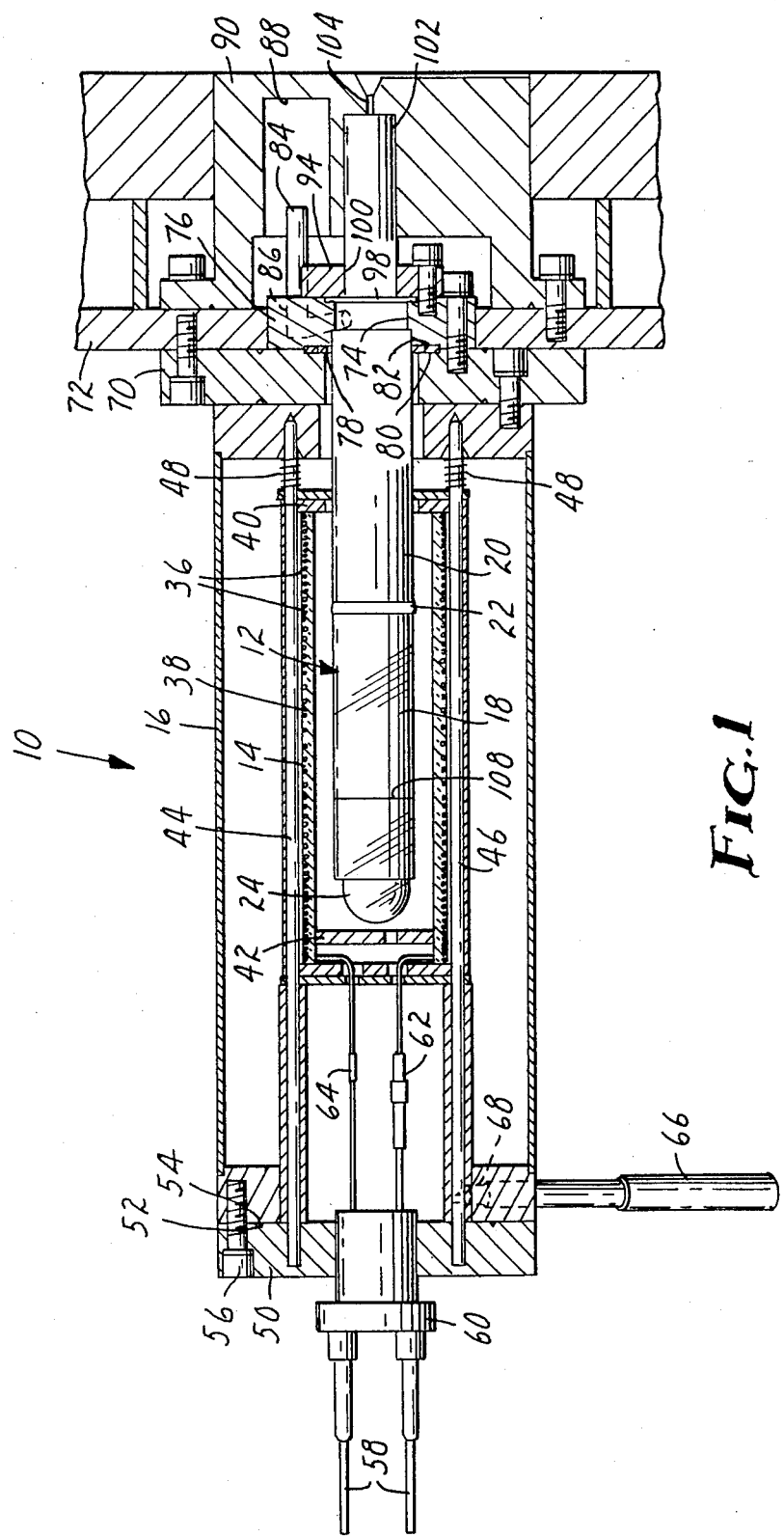
FIG. 1 is a longitudinal view, partially in cross-section, of a crystal growth reactor according to the present invention.

FIG. 1 illustrates a crystalline growth reactor, generally indicated as 10, which, for reference, is approximately 300 mm long and 80 mm in dimeter. The main components of the reactor 10 are a crystal growth reaction chamber or tube 12, a heater assembly 14 enclosing the reaction tube 12, and a vacuum tube 16 enclosing both the reaction tube 12 and the heater assembly 14.

The purpose of the reaction tube 12 is to carry out experiments in chemical or physical vapor transport crystal growth by which the purity, homogeneity and size of crystals or thin films may be enhanced in order that the characteristics and properties of the crystals or films may be studied. In general, vapor transport crystal growth includes heating a source material above its vaporization temperature and providing a deposition surface which is cooled below the crystallization temperature of the source material. Source material vapor migrates to the cooled deposition surface and recrystallizes in highly ordered crystals or films (hereinafter "crystals" includes films). The transport path of the source material vapor is provided with a buffer or transport agent which is either inert with respect to the source material at its vaporization temperature (physical vapor transport) or reacts in a controlled manner with the source material (chemical vapor transport).

The vapor transport crystal growth process takes place within the reaction tube 12, shown in greater detail in FIG. 2, which is comprised of a glass tube 18 and a metal tube 20 joined at a glass-to-metal seal 22. The metal tube 20 is provided to impart mechanical strength and rigidity to the reaction tube 12 and thereby allows the tube 12 to be repeatedly sealed and demounted with respect to the reactor 10. The metal tube 20 is preferably stainless steel to provide inertness with respect to the process materials. The glass tube 18 is preferably fused silica or quartz for inertness and is provided to allow visual observation of crystal growth within the reaction tube 12. The glass tube 18 is provided with a closed end 24 in which is located a source material captured in a glass wool stuffing 26. Adjacent the closed end 24 is a section of internal threads 28 which are formed by a method to be described later. Between the threads 28 and the glass wool stuffing 26 is located a stainless steel ring 30 which includes a screened central bore 32. The stainless steel ring 30 is provided to retain the glass wool stuffing 26 within the closed end 24 of the reaction tube 12 and is held in place by a helically coiled tungsten wire 34 which engages the internal threads 28 of the glass tube 18.

The reaction tube 12 is surrounded by the heater assembly 14 which is provided to heat the source material within the closed end 24 of the glass tube 18 to a temperature above its vaporization temperature. The heater assembly 14 includes an electrical resistance heater 36, which may assume a variety of configurations, such as rod heaters. The preferred configuration, however, is resistance wire which is helically wound to surround the reaction tube 12 and provide equal spacing between the wire 36 and the reaction tube 12. The wire heater 36 is not wound at a constant pitch but is coiled differentially to maintain a constant temperature throughout the free transport length of the reaction tube 12. The wire heater 36 is supported by a ceramic tube 38 which is contained between an insulating ring 40 and an insulating plate 42. The entire heater assembly 14 is supported on rods 44 and 46 and is compressed by springs 48 which absorb shock and vibration. Heat transfer from the wire heater 36 to the reaction tube 12 is accomplished by radiation alone or radiation and conduction between the ceramic tube 38 and the reaction tube 12 by means of beryllium copper leaf springs (not shown) which may resiliently support the reaction tube 12 with respect to the ceramic tube 38.

The heater assembly 14 is surrounded by a cylindrical vacuum tube 16 which is sealed by an end cap 50 by means of a circular V-groove 52 in the end cap 50 which contains a one millimeter diameter indium wire 54. When compressed by bolts 56, the indium wire 54 produces a high quality vacuum seal between the end cap 50 and the vacuum tube 16. The indium wire 54 seal is common throughout the structure and is found wherever two plates are in contact.

The wire heater 36 is provided with electrical power by means of external contacts 58 which extend through a plug 60 welded to the end cap 50 to contact the wire heater 36 by means of connectors 62 and 64. The vacuum within the vacuum tube 16 is provided by means of a copper tube 66 which communicates with the interior of the vacuum tube 16 by means of a passageway 68. A vacuum is drawn and the tube 66 pinched closed to seal the vacuum tube 16. A vacuum surrounding the heater assembly 14 is provided to insulate the heater assembly 14 from the surroundings.

The vacuum tube 16 is bolted and sealed to a base ring 70 which is in turn bolted and sealed to a base plate 72. Although only one reactor 10 is illustrated, the base plate 72 may extend to support additional reactors 10.

The stainless steel tube 20 comprising the open end of the reaction tube 12 is welded to a bore 74 within an end flange 76, which is bolted and sealed to the base ring 70. The seal between the base ring 70 and the end flange 76 is accomplished by means of a copper gasket 78 which is captured between knife edges 80 and 82 formed on the base ring 70 and the end flange 76, respectively.

The reaction tube 12 is evacuated of air and filled with a buffer gas by means of a copper tube 84 which is brazed to the end flange 76 and communicates with a passageway 86 within the flange 76. The passageway 86 opens into the bore 74 of the flange 76 and thus communicates with the interior of the reaction tube 12. Once the reaction tube 12 is filled, the evacuation tube 84 is pinched closed and cut to fit within a recess 88 formed in a heat sink cap 90 which is assembled to the base plate 72 as will be described later.

Prior to assembly of the heat sink cap 90 to the base plate 72, the bore 74 of the flange 76, and therefore the interior of the reaction tube 12, must be sealed. The reaction tube 12 is sealed by means of a platen tube 92 and a sealing cap 94 which is bolted to the end flange 76. The platen tube 92 is a thin-walled metal tube which is sealed at one end by a copper platen 96 brazed to the tube 92. Adjacent and brazed to the opposite end of the platen tube 92 is a radially-extending copper gasket 98 which is captured between the sealing cap 94 and the end flange 76 to close and seal the interior of the reaction tube 12. The sealing cap 94 includes a central bore 100 which accommodates a heat pipe 102 extending from the heat sink cap 90 through the sealing cap 94 and into contact with the copper platen 96.

The last assembled piece is the heat sink cap 90 which is bolted to the base plate 72 and which captures the heat pipe 102 and maintains the heat pipe 102 in contact with the platen 96. The purpose of the heat sink cap 90 and the heat pipe 102 is to transfer heat away from the copper platen 96 and thus maintain the platen 96 at a temperature which is below the crystallization temperature of the source material within the reaction tube 12. Thus, vaporized molecules of the source material will be induced to crystallize on the surface of the copper platen 96 or an attached substrate.

The heat pipe 102 is hollow and the heat sink cap 90 is provided with a bore 104 to accommodate a thermocouple which extends into a recess 106 formed in the copper platen 96 to enable the temperature of the platen 96 to be monitored.

The crystal growth reactor 10 may be disassembled to obtain the crystals grown on the copper platen 96 by first unbolting the heat sink cap 90 and removing this cap 90 along with its attached heat pipe 102. Next the sealing cap 94 is unbolted and removed, which frees the gasket 98 attached to the platen tube 92. Once the sealing cap 94 is removed, therefore, the platen tube 92 and its attached copper platen 96 may be withdrawn from the reaction tube 12 and the crystals recovered. Once the copper platen 96 is removed, access to the closed end 24 of the glass tube 18 is available and thus the supply of source material may be replaced. Once the source material is replaced, the crystal growth reactor 10 may be reassembled simply by replacing the platen tube 92, the sealing cap 94, the heat sink cap 90 and its associated heat pipe 102. Thus the reactor 10 may be reused an indefinite number of times, since the glass tube 18 need not be broken to recover the crystals, as was the usual prior procedure.

Figure 4:
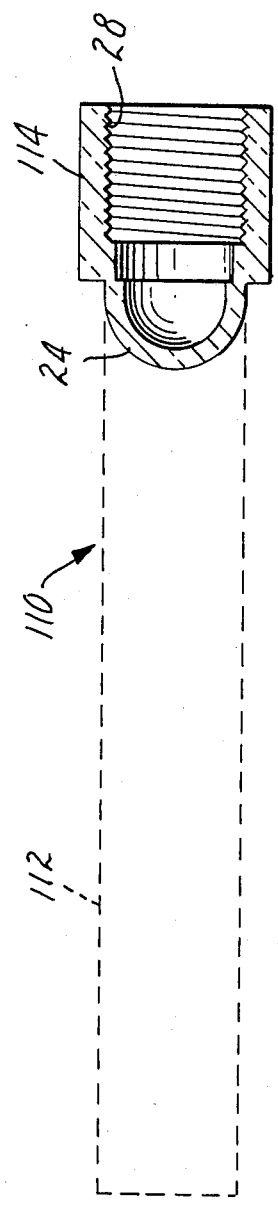
FIG. 4 is a longitudinal, cross-sectional view of the tip portion of the reaction chamber of FIG. 2.
Figure 5:
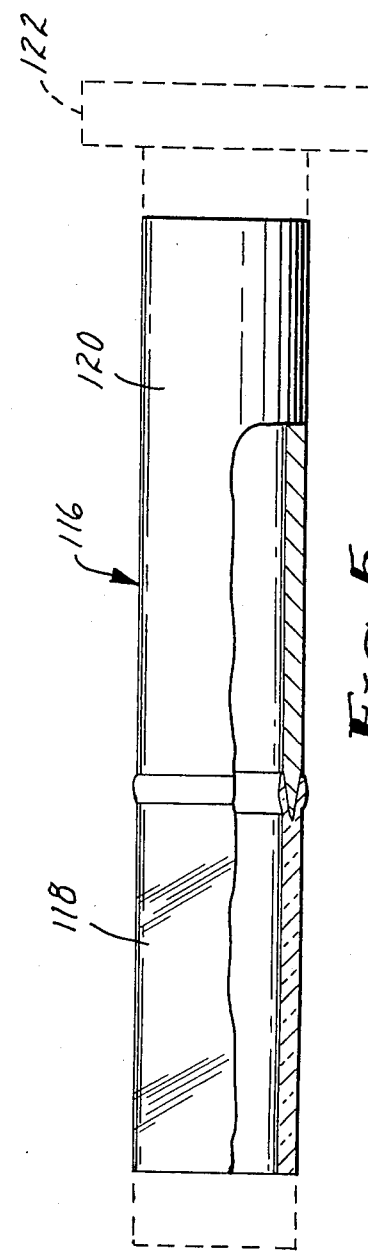
FIG. 5 is a longitudinal view, partially in cross-section, of the body portion of the reaction chamber of FIG. 2.

FIGS. 3-5 illustrate the reaction tube 12 and its component parts. As stated above, the reaction tube 12 consists of a stainless steel tube 20 and a glass tube 18. The glass tube 18 includes the closed end 24 and the internal threads 28. The glass tube 18 is actually formed of two pieces which are fused approximately at the line 108. With reference to FIG. 4, the closed end 24 of the glass tube 18, including the threaded section 28, is preferably formed from a threaded connector 110 manufactured under the designation No. 7644, 11 mm, by the Ace Glass Corporation of Vineland, N.J. The threaded connector 110 is available commercially as a glass tube having an elongated body portion 112 and a threaded end section 114. The original shape of the threaded connector 110, as purchased, is illustrated in FIG. 4 by the threaded end section 114 and the body portion 112 illustrated by phantom lines. To adapt the threaded connector 110 for use in the crystal growth reactor 10, the body portion 112 of the connector 110 is cut and formed into the closed end 24 of the reaction tube 12.

As illustrated in FIG. 5, the remainder of the reaction tube 12 is formed from a glass adapter 116 manufactured by the Huntington Corporation of Mountain View, CA, under the designation VFP-075. This adapter 116, as manufactured, consists of a glass tube 118 sealed to a stainless steel tube 120 which includes a stainless steel end flange 122. To modify the glass adapter 116 for use in the growth reactor 10, a portion of the glass tube 118, indicated by phantom lines, is removed and the end flange 122 and a portion of the stainless steel tube 120, also indicated by phantom lines, is likewise removed. The final step in the production of the reaction tube 12 is to fuse the threaded end section 114 of FIG. 4 to the glass tube portion 118 of the glass adapter 116 of FIG. 5. There results the reaction tube 12 as described above with respect to the crystal growth reactor 10 and illustrated in FIG. 3.

The crystal growth reactor 10 described above includes all the necessary features of laboratory reactors previously used, and additionally provides the advantageous features of easy disassembly and reuse. The ability to disassemble the reactor 10 is highly useful in that crystals grown on the platen 96 may be obtained without breaking the reaction tube 12 and possibly destroying the crystals.

Although the present invention has been described with reference to only a single embodiment, it is recognized that many modifications will be apparent to one skilled in the art. All such modifications which fall within the spirit and scope of the appended claims are intended to be included within the invention.

I claim:

1. A vapor transport reactor comprising:

a composite reaction tube having a closed containment end and an open end, said composite tube including a metal tube providing said open end and a coaxial transparent glass tube providing said closed containment end, said metal tube and said glass tube being joined intermediate said opened and closed ends;

a source material contained within said reaction tube and disposed at said closed end;

means for heating said reaction tube in the region of said source material to a temperature in excess of the vaporization temperature of said source material at the pressure with said reaction tube to thereby produce a vapor of said source material within said reaction tube;

a platen disposed within said reaction tube between said open and said closed ends and exposed to said source material vapor for the deposition of crystallized source material;

means for cooling said platen below the crystallization temperature at the pressure within said reaction tube to cause said deposition of crystallized source material on said platen; and means for demountably sealing said open end of said reaction tube to contain said source material vapor within said reaction tube and permit the recovery of said crystallized source material.

2. A reactor according to claim 1 further comprising means for evacuating and filling said tube with a transport agent after sealing said open end of said tube.

3. A reactor according to claim 1 wherein said platen terminates in a flat surface exposed to said source material vapor, which surface is disposed perpendicular to the longitudinal axis of said tube.

4. A reactor according to claim 3 wherein said platen surface is copper.

5. A reactor according to claim 1 wherein said means for heating said tube is a helically wound resistance wire surrounding said tube.

6. A reactor according to claim 5 wherein said resistance wire is wound in a variable-pitch helix to maintain a relatively constant temperature within said tube between said source material and said platen.

7. A reactor according to claim 1 wherein said means for cooling said platen comprises a heat pipe in heat-conductive contact with said platen and extending away from said closed end of said tube and beyond said means for heating said tube.

8. A reactor according to claim 1 further including a hermetically sealed vessel enclosing said vapor transport reactor for containing a vacuum which thermally insulates said reactor from its surroundings.

9. A reactor according to claim 1 wherein said means for demountably sealing said open end of said tube comprises an end flange including a central bore into which said tube is inserted and welded to said end flange, and a sealing cap closing said end flange bore.

10. A vapor transport reactor according to claim 1 wherein said composite tube includes internal helical threads adjacent said closed containment end and means engaging said threads for retaining said source material within said closed end.

11. A vapor transport reactor according to claim 1 wherein said metal tube and said glass tube are cylindrical with substantially corresponding inner and outer diameters.

12. A vapor transport reactor according to claim 11 wherein said metal tube and said glass tube are approximately of equal length.

* * * * *